United States Patent
Lee

(10) Patent No.: US 6,848,095 B1
(45) Date of Patent: Jan. 25, 2005

(54) METHOD OF ASSIGNING LOGIC FUNCTIONS TO MACROCELLS IN A PROGRAMMABLE LOGIC DEVICE

(75) Inventor: Chong M. Lee, Colorado Springs, CO (US)

(73) Assignee: Lattice Semiconductor Corp., Hillsboro, OR (US)

( * ) Notice: Subject to any disclaimer, the term of this patent is extended or adjusted under 35 U.S.C. 154(b) by 151 days.

(21) Appl. No.: 10/150,410

(22) Filed: May 17, 2002

(51) Int. Cl.[7] .......................... G06F 17/50; G06F 19/00
(52) U.S. Cl. .......................................... 716/17; 716/16
(58) Field of Search .................. 716/16–17; 326/37–41

(56) References Cited

U.S. PATENT DOCUMENTS

| | | | |
|---|---|---|---|
| 4,871,930 A | * | 10/1989 | Wong et al. .................. 326/39 |
| 5,015,884 A | * | 5/1991 | Agrawal et al. ............... 326/39 |
| 6,229,337 B1 | * | 5/2001 | Xiao et al. ..................... 326/41 |
| 6,255,847 B1 | | 7/2001 | Chan et al. .................... 326/41 |
| 6,294,925 B1 | | 9/2001 | Chan et al. .................... 326/37 |
| 6,531,890 B1 | * | 3/2003 | Agrawal et al. ............... 326/41 |

OTHER PUBLICATIONS

"ispLSI® 5000V Family Architectural Description" published in Dec. 2001 by Lattice Semiconductor Corporation.

* cited by examiner

Primary Examiner—Vuthe Siek
Assistant Examiner—Paul Dinh

(57) ABSTRACT

A method of assigning logic functions to macrocells assures that a maximum number of macrocells are assigned two or more logic functions. A first logic function is assigned to a macrocell without restriction. Rules are then applied to the macrocell to determine whether a second logic function may be assigned to the macrocell, and, if so, whether any restrictions exist on what the second logic function may be.

22 Claims, 6 Drawing Sheets

US 6,848,095 B1

METHOD OF ASSIGNING LOGIC FUNCTIONS TO MACROCELLS IN A PROGRAMMABLE LOGIC DEVICE

TECHNICAL FIELD

The present invention relates to programmable circuits. More particularly, the present invention relates to assigning multiple logic functions to a macrocell in a programmable logic device.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

A type of PLD called a complex programmable logic device (CPLD) is shown in FIG. 1. A CPLD 10 includes a plurality of generic logic blocks (GLB), such as GLB 12. The GLBs are in groups of four within segments, such as segment 14. Each segment includes a local segment switching matrix (SSM), such as shown at 16. The SSM allows for programmable routing of signals between the GLBs. A global switching matrix (GSM) 18 allows for programmable interconnection between the segments. Four I/O banks 20 allow connection to pins (not shown) on the outside of the CPLD.

Within each GLB 12 are a plurality of programmable macrocells. Macrocells are well known in the art, an example of which is shown and described in U.S. Pat. No. 6,255,847 (the '847 patent). The macrocell described therein is capable of performing two logic functions, or dual logic functions, concurrently within a single macrocell.

Certain limitations exist on the use of dual logic macrocells. For instance, if each of two functions requires the use of a register to store its output signal, these two functions may not be performed by the same macrocell. Likewise, if each of two functions requires the introduction of product terms from adjacent macrocells via a product term sharing array, the two functions may not be performed by the same macrocell.

Because restrictions exist on the use of macrocells for more than one logic function, and because the full range of such limitations has not been discerned, in practice these dual function macrocells have been programmed for providing only one logic function at a given time.

It is, therefore, desirable to provide a methodology that allows for programming of multi-function macrocells so that more than one logic function may be utilized concurrently.

SUMMARY

A method is disclosed for programming multiple logic functions into macrocells. The method includes assigning a first logic function to a macrocell. A set of rules or criteria is then used for determining whether a second logic function can be assigned to the same macrocell as the first logic function. If the set of rules is satisfied, the first and second logic functions are assigned to the same macrocell and may be utilized concurrently. However, if the set of riles is not satisfied, the second logic function is assigned to a different macrocell.

The methodology may be extended to macrocells that can perform more than two logic functions.

These and other aspects of the invention will become apparent from the following detailed description, which makes references to the accompanying drawings.

DETAILED DESCRIPTION

Macrocell Overview

Figure 2:
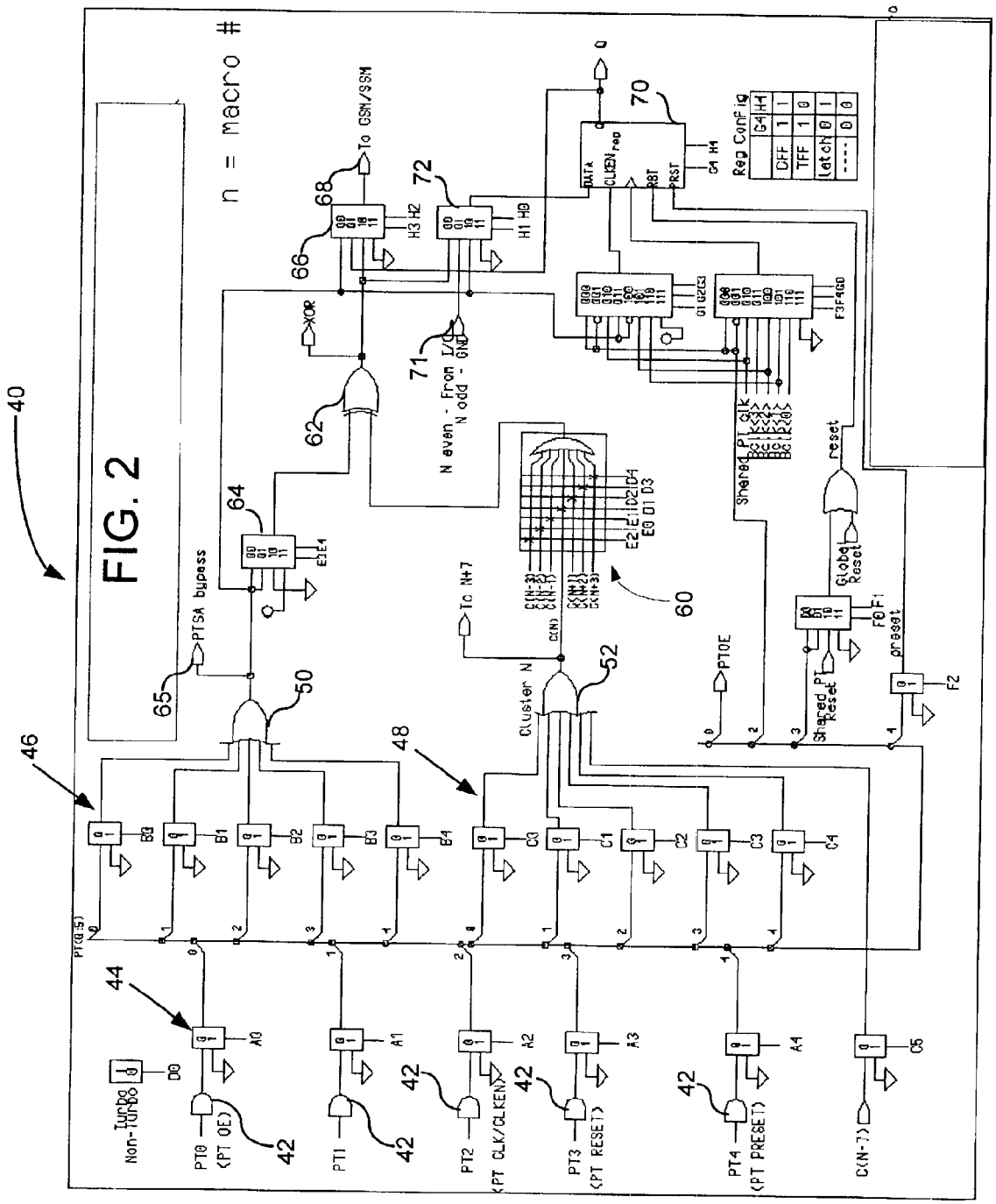
FIG. 2 is a detailed circuit diagram of a macrocell that may be used in a programmable logic device.

FIG. 2 shows an example of a macrocell 40 that may be programmed according to the methodology described herein. The methods described herein may equally be applied to other macrocells, such as the one described in U.S. Pat. No. 6,255,847.

The macrocell 40 receives a plurality of product terms shown as PT0–PT4 coupled to AND gates, shown generally at 42. In current practice, each AND gate 42 has up to sixty-eight inputs. The outputs of the AND gates 42 are fed into multiplexers, shown generally at 44. Control lines to the multiplexers are shown as A0–A4, which may be used to turn on and off the product terms.

Two separate sets of multiplexers 46, 48 are controlled by control signals B0–B4 and C0–C4, respectively. These separate sets of multiplexers may be used to route any of the product terms PT0–PT4 to either of two logic functions, shown in this example as OR gates 50, 52.

The output terminal of OR gate 52 is routed to a product term sharing array (PTSA) 60, which may receive product terms from adjacent macrocells (as shown by the C(N±X) inputs). An EXCLUSIVE OR (XOR) gate 62 has one input terminal coupled to an output terminal of the PTSA 60. The other input terminal of gate 62 is coupled to the output terminal of OR gate 50 through a multiplexer 64. OR gate 50 has an output terminal that may be routed via a PTSA bypass line 65 and multiplexer 66 to the global switching matrix (GSM) 18 or segment switching matrix (SSM) 16. OR gate 50 also has an output terminal that may be routed via a PTSA bypass line 65 to an I/O cell (shown in FIG. 3), as described further below.

The output terminal of XOR gate 62 is routed, via a multiplexer 66, to a macrocell output terminal 68, which is coupled to the GSM/SSM. A single register 70 has a Q output terminal that is routed to multiplexer 66 so that the Q output may be supplied to the GSM/SSM macrocell output terminal 68. The register 70 receives input data from a multiplexer 72. The register 70 may be configured to be an edge-triggered D flip-flop, a toggle flip-flop or a transparent latch (other types of flip-flops may be used depending on the design). An input 71 to multiplexer 72 is coupled to the I/O cell of FIG. 3, as further described below.

Figure 3:
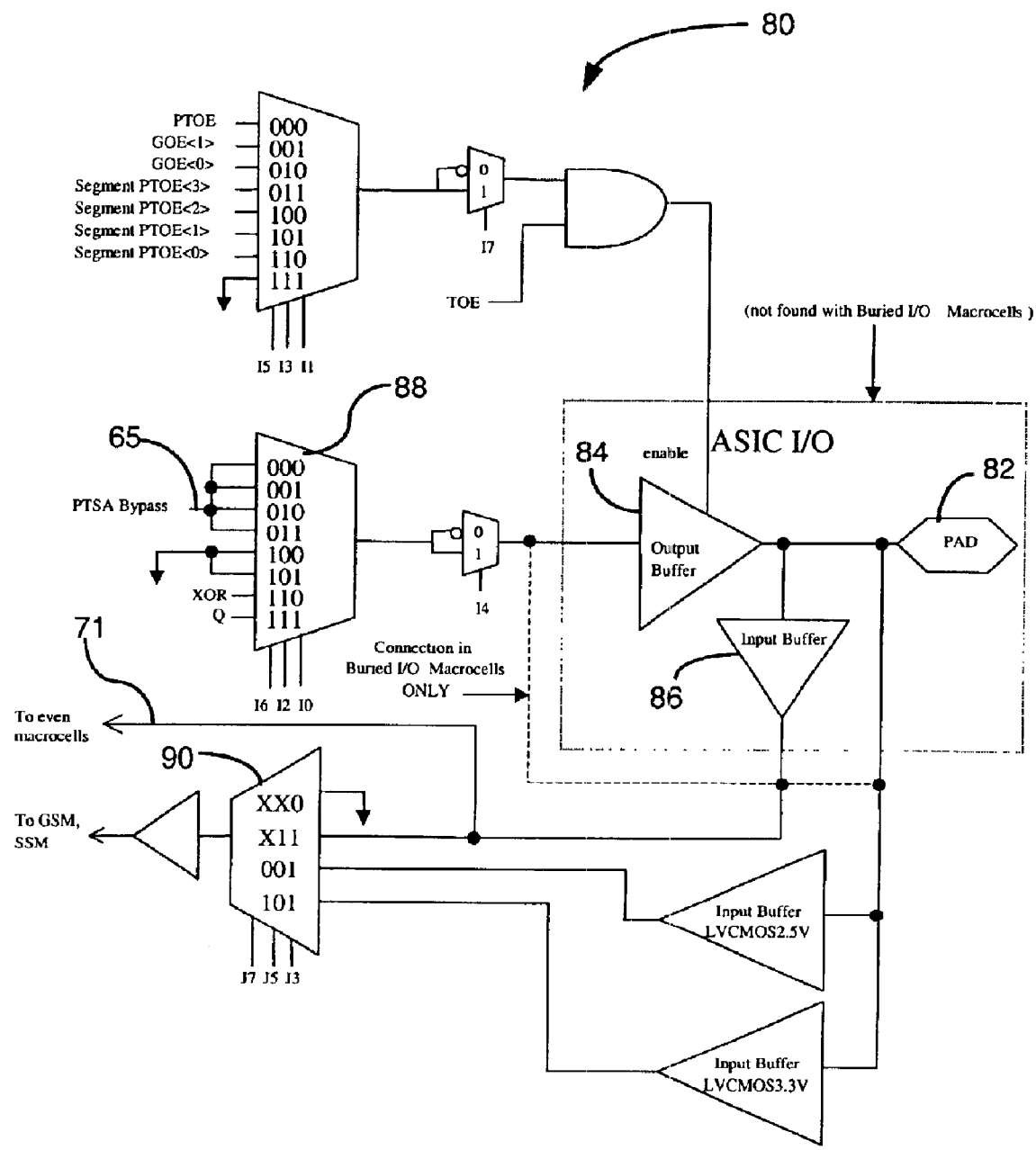
FIG. 3 is a detailed circuit diagram of an I/O block used in conjunction with the macrocell of FIG. 2.

FIG. 3 shows an I/O cell 80. The I/O cell has a pin input/output port 82, which is coupled to a pin (not shown) on the outside of the programmable logic device. An output buffer 84 is used to drive signals to the input/output port 82, while an input buffer 86 is used to receive external signals from the input/output port 82. A multiplexer 88 takes as an input the PTSA Bypass signal 65, the XOR output terminal 62 and the Q output terminal of register 70 described above in relation to FIG. 2. The PTSA Bypass signal allows the output of OR gate 50 (FIG. 2) to pass through multiplexer 88 to the input/output port 82.

A signal received on the input/output port 82 may be routed through the input buffer 86 to a multiplexer 90, and, consequently, to the GSM/SSM. Additionally, the signal may pass from the input buffer and be routed back into macrocell 40, as shown by arrow 71. Such a signal is received at input 71 of multiplexer 72 (FIG. 2), as previously described.

Other features of the cells 40, 80 shown in FIGS. 2 and 3 are not necessary to understand the methodology of programming the macrocell as described herein. Further details of particular features can be found in U.S. Pat. No. 6,255,847, for general background information.

Programming Cells

Figure 1:
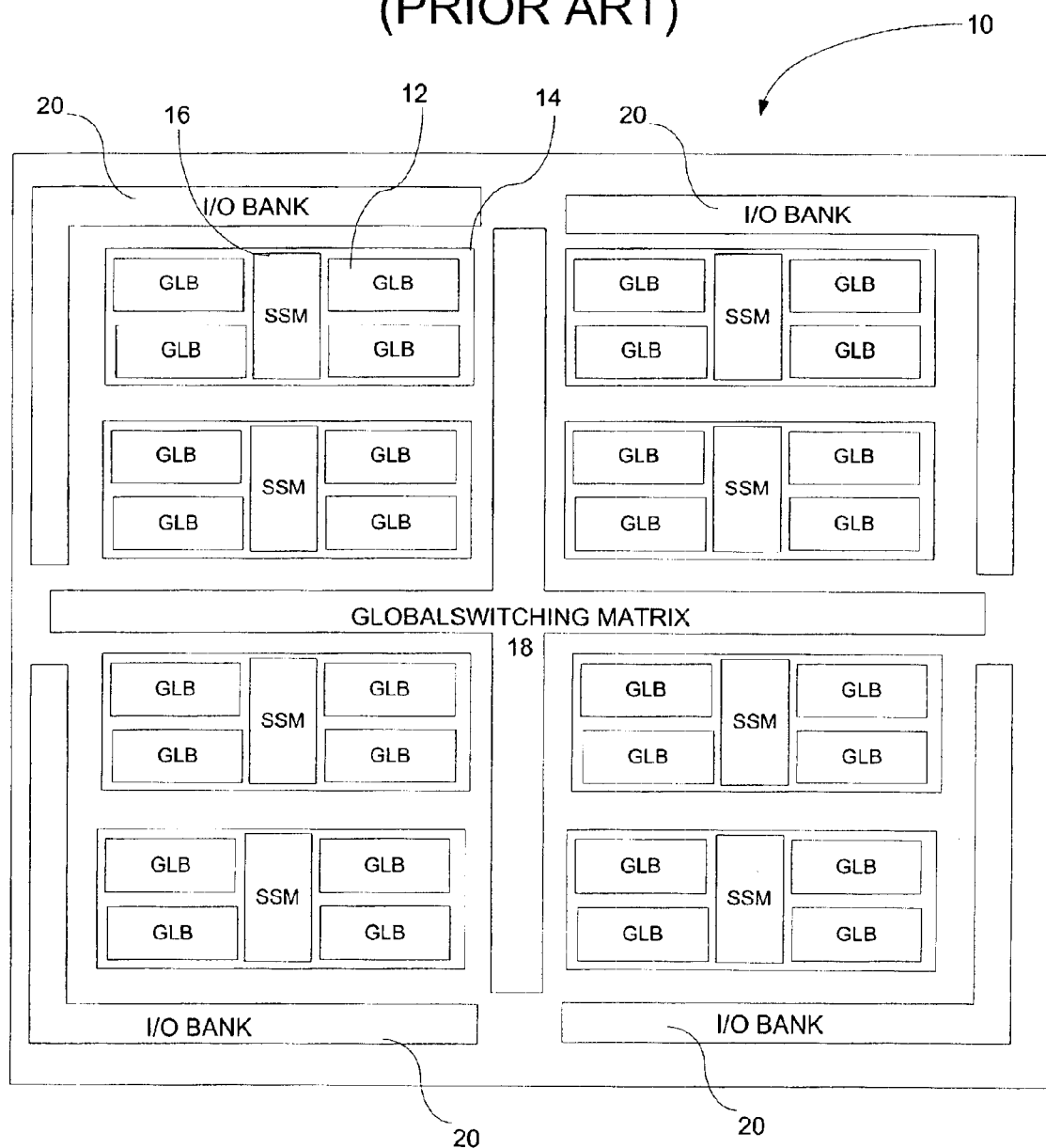
FIG. 1 is a schematic diagram of a prior art complex programmable logic device (CPLD).
Figure 4:
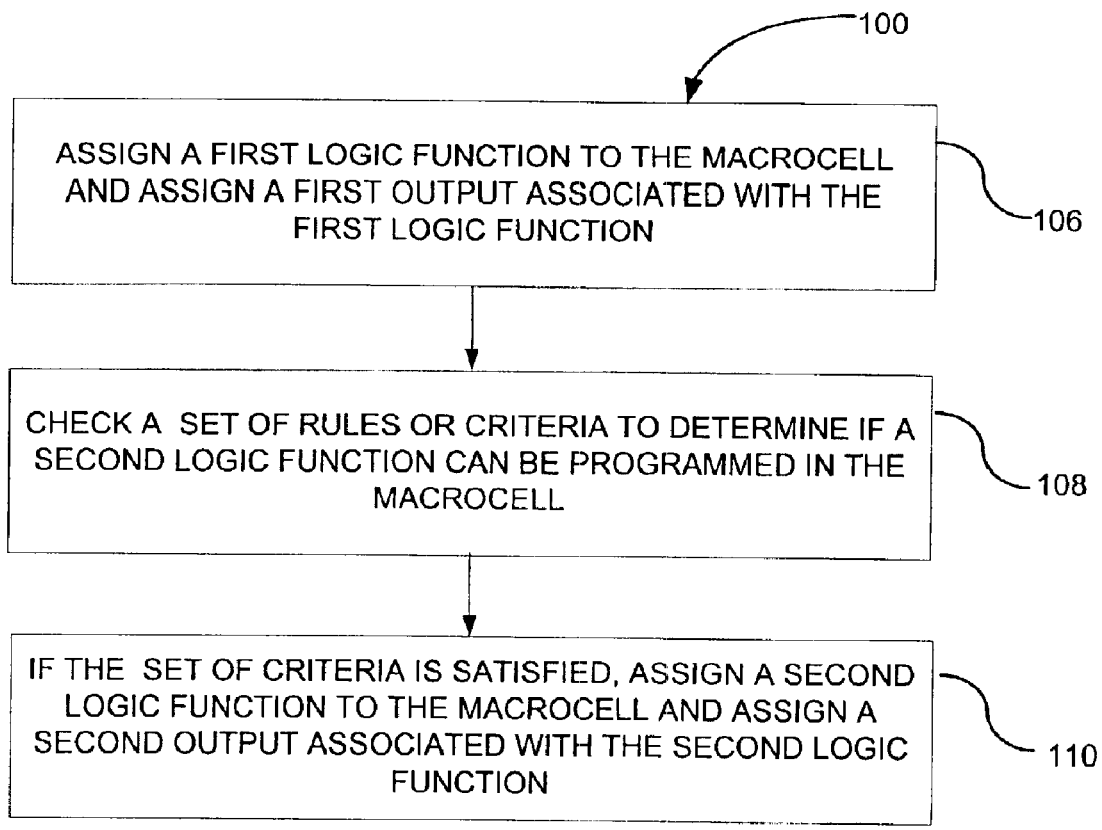
FIG. 4 is a flowchart of a method for assigning multiple functions to a macrocell.

FIG. 4 shows a flowchart 100 of a method for programming multiple functions in a multi-function macrocell, such as the macrocell 40. In a preferred embodiment, the method is performed by a software development tool to program a macrocell within PLD. As described above, a plurality of logic blocks are provided in a programmable logic device (e.g., CPLD) with a switching matrix, such as an SSM, GSM, or both, between the logic blocks. FIG. 1 shows an example of such a CPLD. A macrocell such as macrocell 40 is provided within one of the logic blocks. The number of macrocells in a logic block varies based on the design. An example, 1024 macrocell programmable logic device has thirty-two macrocells in one logic block and thirty-two logic blocks in the device.

In process block 106, a first logic function is assigned to the macrocell being programmed. In the illustrated example, the logic function can be formed from a single OR gate 50, a single OR gate 52 or an XOR 62 of both OR gates 50, 52. The output of the first logic function is routed to an output terminal of the macrocell. As described in relation to FIG. 2, the output of the first logic function may be routed internally to the GSM/SSM macrocell output terminal 68 via output multiplexer 66. Alternatively, the output may be routed via the I/O cell 80. Routing to the I/O cell is accomplished via the multiplexer 88 of the I/O cell 80. After passing through multiplexer 88, the output of the first logic function may be routed to the input/output port 82 and may be fed back to the GSM/SSM via input buffer 86 and multiplexer 90.

In process block 108, a check is made of a set of criteria or rules to determine if a second logic function can be programmed in the macrocell, given the existence of the first logic function therein. An exemplary set of rules is described further below in relation to FIG. 5. In process block 110, if the set of criteria is satisfied, then the second logic function is assigned to the macrocell so that two logic functions may be utilized concurrently. For example, the second OR gate 52 is assigned a function and the output terminal of the OR gate 52 is routed to one of the output terminals of the macrocell that is not being used by the first logic function. Typically, one of the logic functions uses the GSM/SSM output terminal 68 from the multiplexer 66 and the other logic function is outputted through the I/O cell 80. Thus, the macrocell performs two separate logic functions and each logic function output has a respective output terminal from the macrocell.

Figure 5:
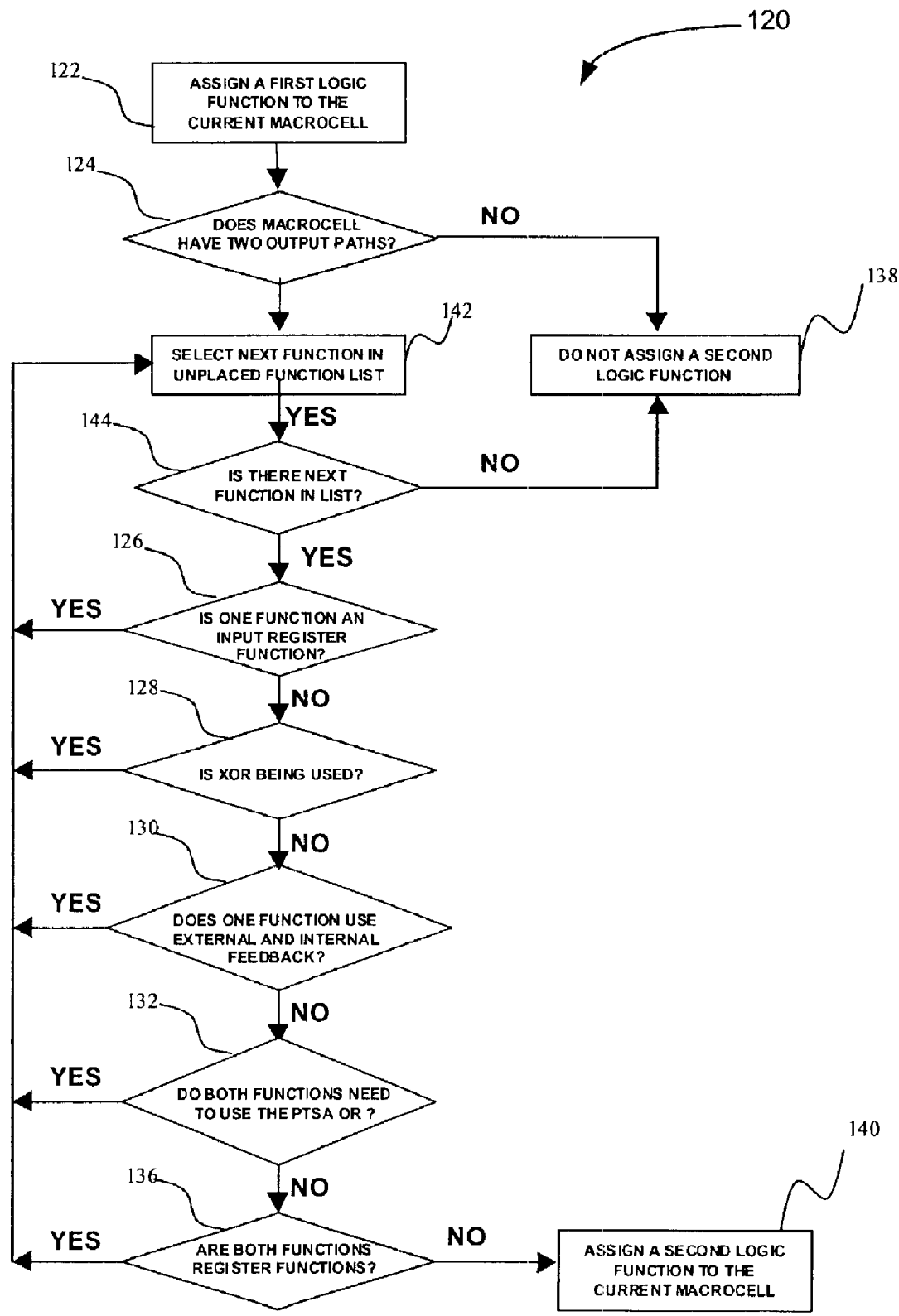
FIG. 5 shows a detailed flowchart of the method for assigning of FIG. 4.

FIG. 5 shows a more detailed flowchart 120 showing a check of the set of criteria or rules to determine if a second logic function may be stored in a current macrocell. In process block 122, the first logic function is assigned to the macrocell. In process block 124, a determination is made as to whether the macrocell has two output paths. More particularly, a determination is made whether the macrocell has both macrocell and I/O pin feedback paths so that it can perform at least two logic functions. Each logic function requires either a macrocell feedback path or an I/O pin feedback path, as discussed above. A typical programmable logic device may only have one-half of the number of I/O cells 80 as logic macrocells 40. Thus, only logic macrocells that have an associated I/O cell may be used for dual logic function programming. If process block 124 is answered in the negative, a second logic function is not assigned to the current macrocell as indicated in process block 138.

If process block 124 is answered affirmatively, the method continues with process block 142. In process block 142, the next logic function in a list of unassigned logic functions to be programmed into a macrocell is selected and obtained. In process block 144, a determination is made as to whether there is a next logic function on the list. If process block 144 is answered in the negative, a second logic function is not assigned to the current macrocell as indicated in process block 138.

If process block 144 is answered affirmatively, the method continues with process block 126. In process block 126, a determination is made whether one of the two logic functions is an input register function. An input register function uses both an I/O pin (for source signal) and the macrocell feedback. Thus, in FIG. 3, the input/output port 82 is used and the macrocell feedback 71 is used. The macrocell feedback 71 is typically routed through multiplexer 72 (FIG. 2) to register 70. The output of register 70 is then routed through multiplexer 66 to the output terminal 68 of the macrocell. Thus, when an input register function is used there is no other available output terminal for a second logic function to use. Accordingly, if the first logic function on a given macrocell is an input register function, the macrocell cannot perform a second logic function. Also, if the currently tested logic function is an input register function, then it cannot be selected as the second logic function. If process block 126 is answered in the affirmative, then the method proceeds back to process block 142 to select the next logic function in the unassigned logic function list.

If process block 126 is answered in the negative, then the method proceeds to process block 128. In process block 128, a determination is made whether an XOR function is being used. An XOR gate 62 uses outputs of both OR gates 50, 52. Accordingly, if the first logic function on a given macrocell is an XOR function, the macrocell cannot perform a second logic function. Also, if the currently tested logic function is an XOR function, then it cannot be selected as the second logic function. Thus, if process block 128 is answered in the affirmative, then the method proceeds back to process block 142 to select the next logic function in the unassigned logic function list.

If process block 128 is answered in the negative, then in process block 130, a determination is made whether the logic function is a dual feedback function. A "dual feedback function" is a logic function that requires both I/O pin feedback and macrocell feedback. One example of a dual feedback function is a tristate logic function with feedback paths before and after the tristate buffer 84 (see FIG. 3). Another example of a dual feedback function is a logic function with both combinatorial feedback (from the PTSA bypass line 65 or the XOR output terminal 62) and registered feedback from the Q output terminal of register 70. This method of programming dual functions is not limited to other forms of dual feedback functions that can be formed by various combinations of selecting the inputs of the multiplexers 66, 72 and 88. Because both feedback paths in the macrocell are used for one logic function on the macrocell, no feedback path is left for a second logic function. Accordingly, if the first logic function on a given macrocell requires both I/O pin feedback and macrocell feedback, the macrocell cannot perform a second logic function. Also, if currently tested logic function is a dual feedback function, then it cannot be selected as the second logic function. Thus if process block 130 is answered in the affirmative, then the method proceeds back to process block 142 to select the next logic function in the unassigned logic function list.

If process block 130 is answered in the negative, then in process block 132, a determination is made whether the first logic function on the macrocell is implemented with PTSA 60 and the XOR output terminal 62. If the answer is in the affirmative, then the second logic function must be small enough to use the product term sharing array (PTSA) bypass path 65 (see FIG. 2). In order to be small enough to use the PTSA bypass path 65, a logic function must have no more than the maximum product terms accepted by the logic function. For example, FIG. 2 shows that OR gate 50 is limited to having 5 inputs. Thus, using the hardware of FIG. 2, one of the logic functions must be a sum of 5 or less product terms. Of course, other hardware designs will likely have a different product term limit and can be used with the illustrated method. If process block 132 is answered in the affirmative, then the method proceeds back to process block 142 to select the next logic function in the unassigned logic function list.

If, however, process block 132 is answered negatively affirmatively, then in process block 136 a determination is made whether both logic functions require a register. Only one register 70 is available in the illustrated macrocell. If both logic functions require the use of a register, then a second logic function cannot be selected. If process block 136 is answered in the affirmative, the method proceeds back to process block 142 to select the next logic function in the unassigned logic function list. Of course, if more than one register is available for a macrocell, then additional register functions may be programmed in the macrocell.

If process block 136 is answered in the negative, then the second logic function is assigned to the macrocell as illustrated in process block 140.

An additional process block (not shown) may be inserted into the methodology. For bonded-out blocks, if the first logic function is an output function, the second logic function cannot be another output function, i.e. the second logic function must be a node function. A "bonded-out block", as used in this context, is a block that has at least one I/O pin. (See, for example, I/O pin 82 in FIG. 3.) An "output function", as used in this context, is a logic function that goes out to an external I/O pin of the device. A "node function", as used in this context, is a buried logic function that is generated and used internal to the device, i.e. does not go out to an external I/O pin. Two output functions will not work in a single macrocell because the illustrated macrocells have only one output path to an I/O pin.

There is no hardware restriction against two node functions in a single macrocell, but a software issue exists with two node functions in that one of the node functions should go through the tristate buffer and incur an additional tristate buffer delay. Accordingly, a node function may be paired with an output function on a single macrocell, rather than pairing a node function with another node function.

Consequences of the rules discussed above include the following:

If the first logic function selected for a given macrocell is an input register function, an XOR, or a dual feedback function, that macrocell should not support a second logic function.

If the first logic function selected for a given macrocell is an output function, then the second logic function selected for the same macrocell should not be another output function.

If the first logic function selected for a given macrocell is a register function, then the second logic function selected for that macrocell should not be another register function, i.e. it should be a combinatorial function.

If an XOR function is being used, then a second logic function should not be assigned to the macrocell.

A dual feedback function should not be the second logic function selected for a given macrocell.

If the first logic function selected for a given macrocell uses the PTSA (product term sharing array) OR gate, the second logic function selected for that macrocell must be small enough to use the fast bypass OR gate (fast bypass path). If no logic function is available that is small enough to use the fast bypass OR gate, and no other macrocells can be rearranged to make such a small logic function available, the macrocell should not have a second logic function.

Having illustrated and described the principles of the illustrated embodiments, it will be apparent to those skilled in the art that the embodiments can be modified in arrangement and detail without departing from such principles.

For example, although specific limitations are described in relation to FIG. 5 that are associated with the hardware of FIG. 2 and FIG. 3, some of the limitations may not apply based on the particular hardware. Moreover, the rules represented by process blocks 126 through 136 need not be applied in any particular order., although the logic functions are shown as OR gates, other logic functions may be used, (e.g., AND, NAND, NOR, etc.).

Figure 6:
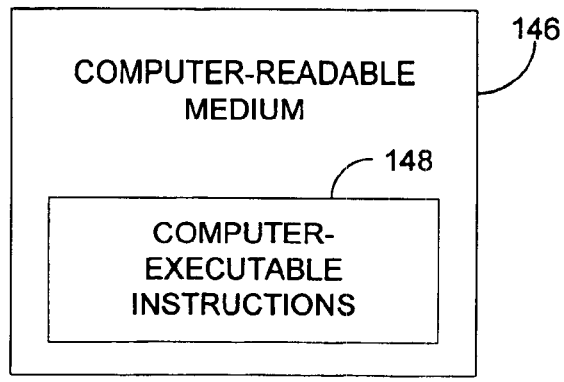
FIG. 6 is a schematic diagram of a computer-readable medium.

Those skilled in the art will recognize that the above rules may be implemented in a computer program and may be automated. FIG. 6 illustrates an embodiment of a computer readable medium 146 having stored thereon computer-executable instructions 148 that perform a method of assigning logic functions to a plurality of macrocells within a programmable logic device. This method of assigning logic functions may include a providing action, where a set of rules is provided regarding assignment of logic functions to macrocells within the programmable logic device. The method may also include an assigning action, where a first logic function is assigned to a macrocell in the plurality. The method may further include an applying action where at least one rule in the set of rules is applied to the macrocell. The method may also include another assigning action, where a second logic function is assigned to the macrocell if it is not restricted from having a second logic function by the application of the at least one rule.

Still further, although the logic functions are programmed in a CPLD, such logic functions may also be programmed in other programmable logic devices, such as field programmable gate arrays.

Figure 7:
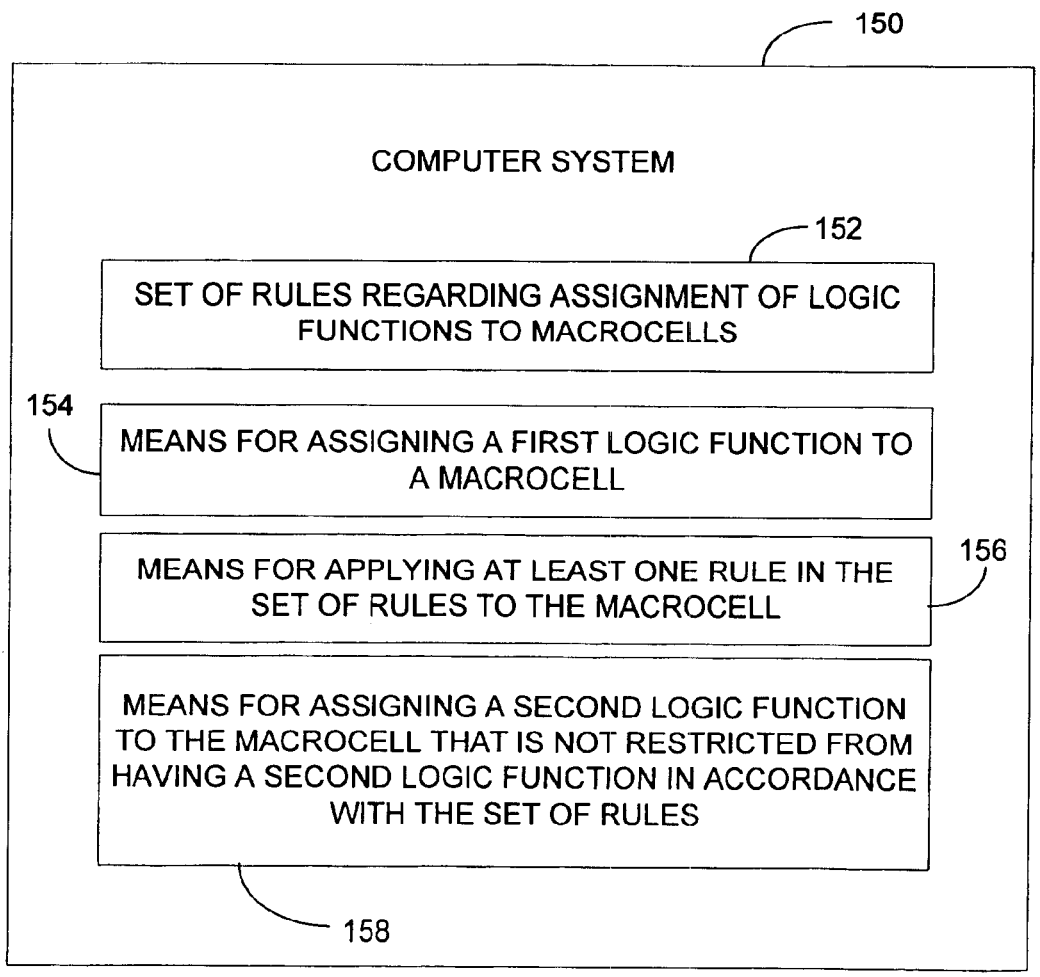
FIG. 7 is a schematic diagram of a computer system.

FIG. 7 illustrates one embodiment of a computer system 150 for assigning logic functions to a plurality of macrocells. The computer system 150 may include a set of rules 152 regarding assignment of logic functions to macrocells. The computer system 150 may also include means 154 for assigning a first logic function to a macrocell in the plurality. The computer system 150 may further include means 156 for applying at least one rule in the set of rules to the macrocell. The computer system 150 may also include means 158 for assigning a second logic function to the macrocell that is not restricted from having a second logic function in accordance with the set of rules 152.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

I claim:

1. A method of assigning logic functions in a programmable logic device, comprising:
   assigning a first logic function within a macrocell;
   assigning a first output from the macrocell that is associated with the first logic function;
   checking a set of criteria to determine if a second logic function can be programmed into the macrocell;
   if the set of criteria is satisfied, assigning the second logic function within the macrocell and assigning a second output from the macrocell that is associated with the second logic function; and
   if the set of criteria is not satisfied, not assigning the second logic function to the macrocell.

2. The method of claim 1, wherein the set of criteria includes determining whether the macrocell has two output paths.

3. The method of claim 1, wherein the set of criteria includes determining whether one of the logic functions is an input register function.

4. The method of claim 1, wherein the set of criteria includes determining if an EXCLUSIVE OR function is used in the macrocell.

5. The method of claim 1, wherein the set of criteria includes determining if one of the logic functions requires two outputs of the macrocell.

6. The method of claim 1, wherein the set of criteria includes determining if both of the logic functions require a register.

7. The method of claim 1, wherein the first and second logic functions are OR functions.

8. A method of assigning logic functions to a plurality of macrocells within a programmable logic device, the method comprising:
   providing a set of rules regarding assignment of logic functions to macrocells within the programmable logic device;
   assigning a first logic function to a macrocell in the plurality;
   applying at least one rule in the set of rules to the macrocell; and
   assigning a second logic function to the macrocell if it is not restricted from having a second logic function by the application of the at least one rule.

9. The method of claim 8, wherein providing the set of rules comprises providing at least one rule that takes into account a physical design of a macrocell to which the rule is being applied.

10. The method of claim 8, wherein providing the set of rules comprises providing a rule that a second logic function is restricted from the macrocell, unless the macrocell has both a macrocell feedback path and an I/O pin feedback path.

11. The method of claim 8, wherein providing the set of rules comprises providing at least one rule that takes into account the first logic function that was assigned to a macrocell to which the rule is being applied.

12. The method of claim 8, wherein providing the set of rules comprises providing a rule that the second logic function is restricted from the macrocell if the first logic function in the macrocell is an input register function.

13. The method of claim 8, wherein providing the set of rules comprises providing a rule that a second logic function is restricted from the macrocell if either the first logic function or the second logic function in the macrocell is an EXCLUSIVE OR function.

14. The method of claim 8, wherein providing the set of rules comprises providing a rule that the second logic function is restricted from the macrocell if the first logic function in the macrocell is a dual feedback function.

15. The method of claim 8, wherein providing the set of rules comprises providing a rule that a second logic function is restricted from the macrocell if the macrocell occurs in a bonded-out block.

16. The method of claim 8, wherein providing the set of rules comprises providing a rule that a second logic function is restricted from the macrocell if the first logic function in the macrocell is a register function.

17. The method of claim 8, wherein providing the set of rules comprises providing a rule that a second logic function is restricted from the macrocell unless one of the two logic functions in the macrocell uses a fast bypass path in the macrocell.

18. The method of claim 8, wherein providing the set of rules comprises providing at least one rule that takes into account the physical placement of a macrocell to which the rule is being applied.

19. A computer-readable medium having stored thereon computer-executable instructions that perform the method of claim 8.

20. A computer system for assigning logic functions to a plurality of macrocells, the system comprising:
   a set of rules regarding assignment of logic functions to macrocells;
   means for assigning a first logic function to a macrocell in the plurality;
   means for applying at least one rule in the set of rules to the macrocell; and
   means for assigning a second logic function to the macrocell that is not restricted from having a second logic function in accordance with the set of rules.

21. A computer-implemented method of assigning logic functions to a macrocell within a programmable logic device, the method comprising:
   assigning a first logic function to a macrocell within the programmable logic device;
   checking if a second logic function can be assigned to the macrocell given the presence of the first logic function therein; and
   assigning the second logic function to the macrocell if both logic functions can be utilized concurrently within the macrocell.

22. An apparatus, comprising:
   a set of rules regarding assignment of logic functions to a plurality of macrocells;
   means for assigning a first logic function to a macrocell in the plurality;
   means for applying at least one rule in the set of rules to the macrocell; and
   means for assigning a second logic function to the macrocell that is not restricted from having a second logic function in accordance with the set of rules.

* * * * *

UNITED STATES PATENT AND TRADEMARK OFFICE
CERTIFICATE OF CORRECTION

PATENT NO. : 6,848,095 B1
DATED : January 25, 2005
INVENTOR(S) : Chong M. Lee

It is certified that error appears in the above-identified patent and that said Letters Patent is hereby corrected as shown below:

Column 7,
Lines 15 and 48, "a macrocell" should be -- a dual function macrocell --.
Lines 50-52, "the macrocell" should be -- said dual function macrocell --
(two occurrences).

Column 8,
Lines 37, 45, 47 and 59, "a macrocell" should be -- a dual function macrocell --.
Lines 49-50, "the macrocell" should be -- said dual function macrocell --
(two occurrences).
Lines 49-50 and 54, "the macrocell" should be -- said dual function macrocell --.
Lines 62-64, "the macrocell" should be -- said dual function macrocell --
(two occurrences).

Signed and Sealed this

Thirty-first Day of May, 2005

JON W. DUDAS
*Director of the United States Patent and Trademark Office*